(12) United States Patent
Hsu et al.

(10) Patent No.: US 6,448,753 B1
(45) Date of Patent: Sep. 10, 2002

(54) DIGITAL METER FOR MEASURING ALTERNATING CURRENT

(76) Inventors: Chao Fou Hsu, 57, Kuang Yuh Road, Kaohsiung 807 (TW); Wei Jen Lin, 57, Kuang Yuh Road, Kaohsiung 807 (TW)

(*) Notice: Subject to any disclaimer, the term of this patent is extended or adjusted under 35 U.S.C. 154(b) by 0 days.

(21) Appl. No.: 09/567,873

(22) Filed: May 8, 2000

(51) Int. Cl.[7] .................. G01R 19/00; G01R 35/04; G01R 7/00
(52) U.S. Cl. .................. 324/76.11; 324/74; 324/142
(58) Field of Search .................. 324/76.11, 115, 324/116, 103 R, 142, 96, 74, 75, 157; 250/231.13, 231.17; 702/58, 61, 62

(56) References Cited

U.S. PATENT DOCUMENTS

| | | | | |
|---|---|---|---|---|
| 4,158,167 A | * | 6/1979 | Tanno et al. | 324/514 |
| 4,301,508 A | * | 11/1981 | Anderson et al. | 324/116 |
| 4,933,631 A | * | 6/1990 | Eccleston | 324/115 |
| 5,089,771 A | * | 2/1992 | Tanguay et al. | 324/142 |
| 5,563,515 A | * | 10/1996 | Kako | 324/391 |

* cited by examiner

Primary Examiner—Michael J. Sherry
Assistant Examiner—Jermele M. Hollington
(74) Attorney, Agent, or Firm—Raymond Y. Chan; David and Raymond Patent Group

(57) ABSTRACT

A digital meter is designed for measuring alternating current and is formed of a metal rotary disk, a light-emitting element, a light-sensing element, a signal wire, and a signal conversion display. The metal rotary disk is provided with a through hole located at an appropriate position thereof The light-emitting element and the light-sensing element are corresponding in location to each other such that they are located on a rotational path of the through hole. As the metal rotary disk completes one revolution, the light-sensing element receives once a light signal is transmitted via the signal wire into the signal conversion display by which the signal is converted into a numerical value of power consumtion. The numerical value of power consumption by a power user is thus attained by a terminal located in the power company without the use of a meter-person.

3 Claims, 4 Drawing Sheets

DIGITAL METER FOR MEASURING ALTERNATING CURRENT

FIELD OF THE PRESENT INVENTION

The present invention relates generally to a structure of an alternating current meter for measuring the power consumption, and more particularly to an electronic digital measuring structure of the alternating current meter, which is capable of converting the power consumption rate of a power user into a digital signal output. A precision measurement of the power consumption is thus made possible by the digital signal output.

BACKGROUND OF THE PRESENT INVENTION

The induction- type alternating current meter is a principal instrument which is used by the power company to measure the power consumption by a power user. The collection of the power consumption data by the power company is done by a person who is hired by the power company to read the meter on site. Such a general practice as described above is not cost-effective and is inefficient at best in view of the fact that the wages and the fringe benefits of the meter-person give an added adminstrative cost, and that the manual reading of the power meter by the meter-person is apt to be erroneous.

The traditional alternating current meter has inherent deficiencies in light of its measurement of the power consumption being done mechanically. There is often a great disparity between a mechanically-measured value and an actual consumption value. As shown in FIGS. 1 and 2, a prior art alternating current meter 10 comprises a voltage magnet 11 (as shown in FIG. 2) capable of generating a movable magnetic field, and a metal disk 12 which is located over the voltage magnet 11 such that the metal disk 12 is induced by the movable magnetic field to turn. As a result, a center shaft 13 of the metal disk 12 actuated to turn by the metal disk 12 in motion. One of tow gears 151 of a counter 15 is meshed with a worm rod 14 which is mounted on the center shaft 13 such that the worm rod 14 turns along with the center shaft 13. As the revolving speed of the metal disk 12 is transmitted to the counter 15, the numerical reading is shown by the counter 15 as a result of the cumulative measuring and switching, which are attained by a plurality of gear trains of the counter 15. In light of the inherent manufacturing tolerance and the error of the engagement ratio of the transmission members of the prior art meter 10, the numerical reading shown by the counter 15 of the meter 10 is not a reliable reflection of the actual power consumption.

SUMMARY OF THE PRESENT INVENTION

It is therefore the primary objective of the present invention to provide a digital meter for measuring the alternating current. The digital meter comprises a light-emitting element and a light sensor for conversion of a power consumption rate into a digital signal, which is then processed by a processing unit such that the power consumption is expressed in various forms, such as watts, cash value, etc.

It is another objective of the present invention to provide a digital meter for measuring the power consumption. The digital meter is electronically linked with a local area network via which the power company gathers the power consumption data of a power user without the use of a meter-person.

DETAILED DESCRIPTION OF THE PREFERRED EMBODIMENT

Figure 1:
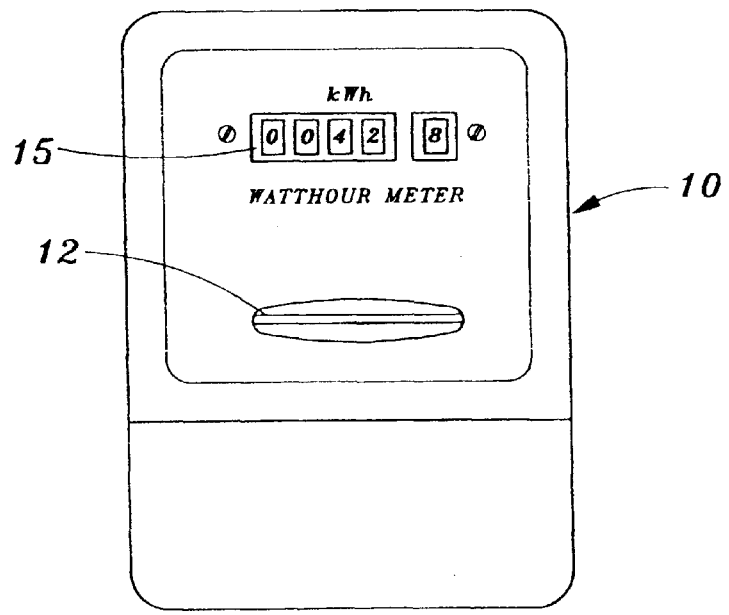
FIG. 1 shows a front view of an induction-type wattmeter of the prior art.
Figure 2:
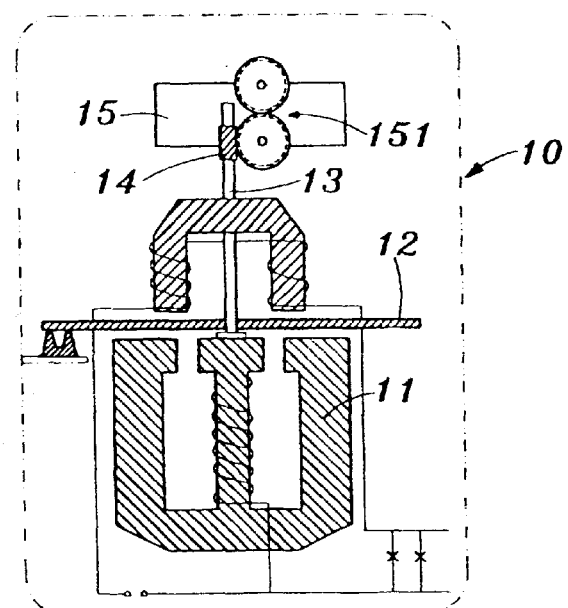
FIG. 2 shows a sectional schematic view of an induction-type wattmeter of the prior art.
Figure 3:
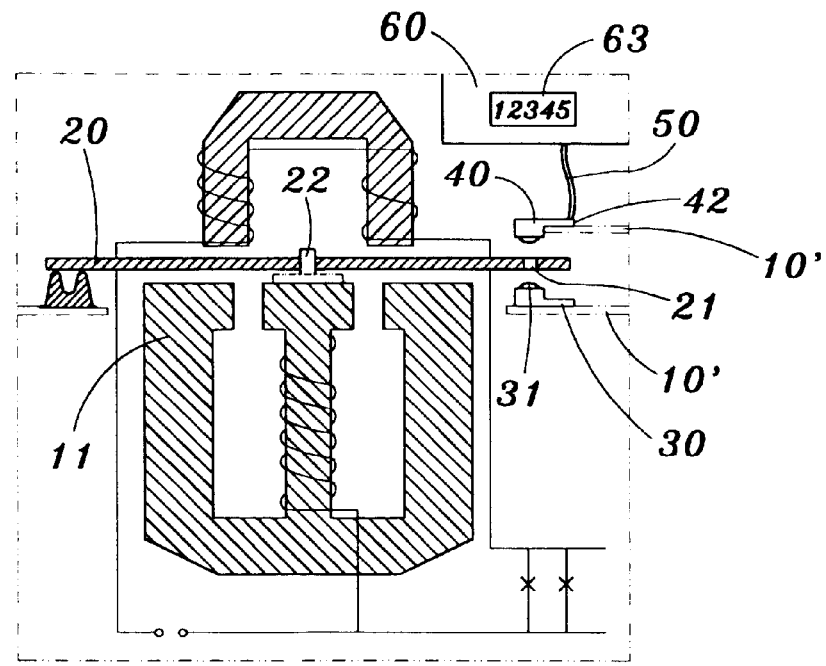
FIG. 3 shows a sectional schematic view of the present invention.
Figure 4:
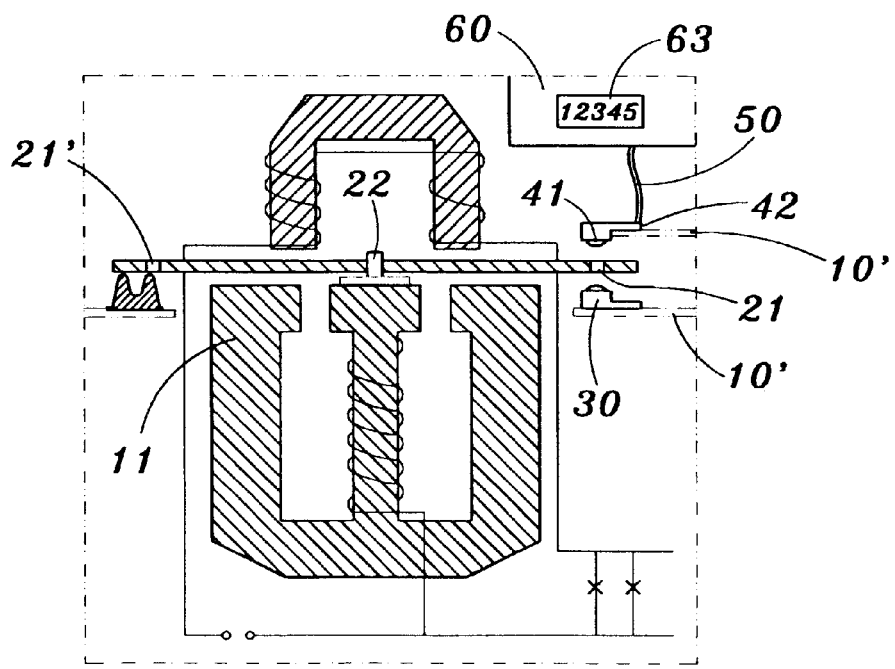
FIG. 4 shows another sectional schematic view of the present invention.

Referring to FIG. 3 and FIG. 4, a digital meter for measuring alternating current according to a preferred embodiment of the present invention comprises a housing 10', a metal rotary disk 20, a light-emitting element 30, a light-sensing element 40, a signal wire 50, and a signal conversion display 60.

The housing 10' is provided in the interior thereof with a voltage magnet 11, The metal rotary disk 20 is mounted over the voltage magnet 11 and provided with a vertical through hole 21, or one or more vertical through holes 21', as shown in FIG. 4. The metal rotary disk 20 is mounted on a shaft 22 which is pivoted at the bottom end to the housing 10', as shown by the imaginary lines in FIG. 3. The metal rotary disk 20 is induced by a magnetic field of the voltage magnet 11 to turn. As a result, the shalt 22 turns along with the rotary disk 20. The light-emitting element 30 and the light-sensing element 40 are fixed on the housing 10' such that the light-emitting element 30 is corresponding in location to one surface of the metal rotary disk 20, and that the light-emitting element 30 is separated from the metal rotary disk 20 by a predetermined distance. The light-emitted 30 by a light-emitting end 31 of the light-emitting element 30 is projected on the rotational path of the vertical through hole 21. The light-sensing element 40 is opposite to other surface of the rotary disk 20 and is separated from the metal rotary disk 20 by a predetermined distance. The light-receiving end 41 of the light-sensing element 40 is corresponding in location to the light-emitting end 31 of the light-emitting element 30. The signal wire 50 is connected at one end with a signal output end 42 of the light-emitting element 40 such that the signal wire 50 is connected at other end thereof with the signal conversion display 60 which is fixed in the interior of the housing 10' for receiving the light signal of the signal wire 50. The light signal is then converted into a numerical value of power consumption.

Figure 5:
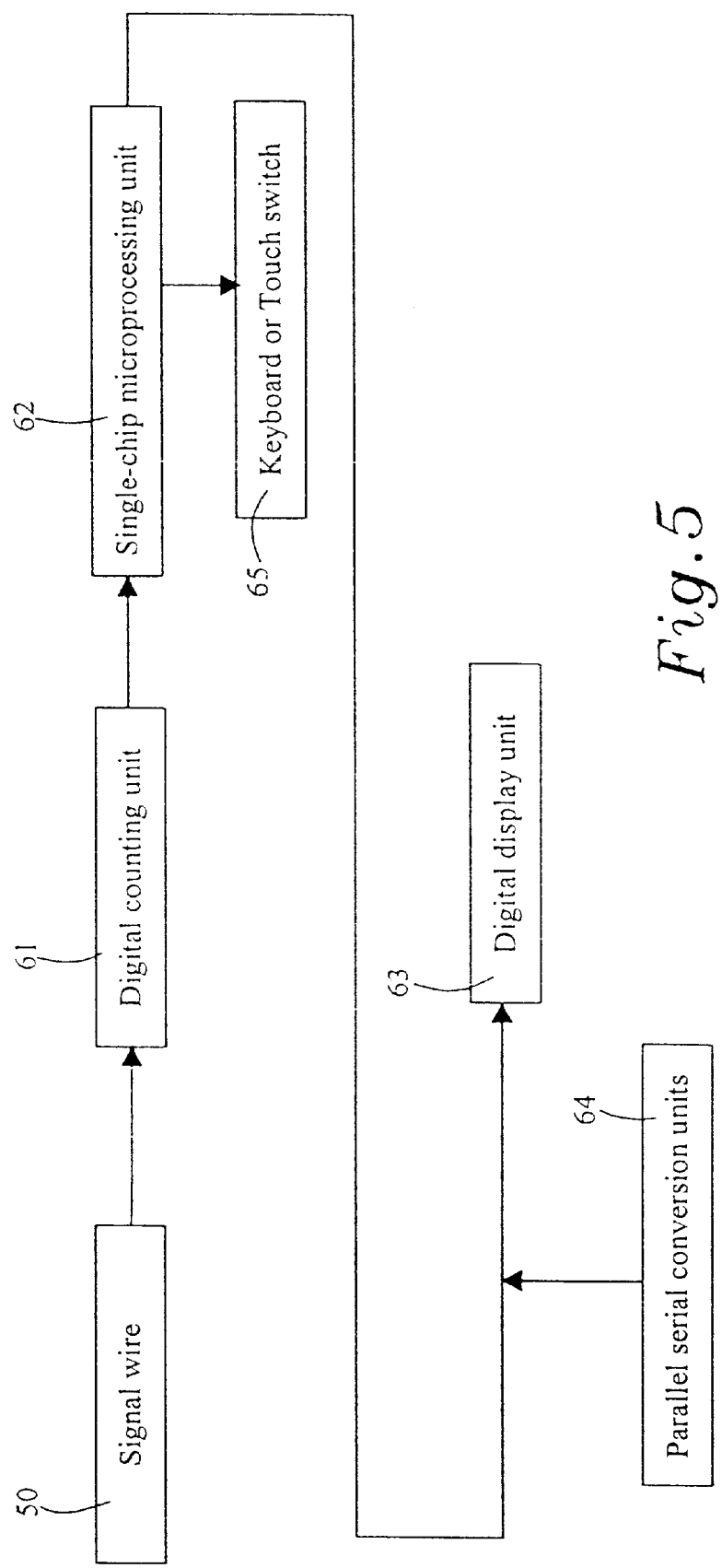
FIG. 5 shows a circuit block diagram of a signal conversion display of the present invention.

As shown in FIG. 5, the signal conversion display 60 comprises a digital counting unit 61, a single-chip microprocessing unit 62, and a digital display unit 63. The digital counting unit 61 is connected to the signal wire 50 for converting the light signal of the light-sensing element 40 into a digital signal, which is then decoded before being sent to the single-chip microprocessing unit 62 for conversion into the numerical value of power consumption. The memory of the single-chip microprocessing unit 62 is provided with a control software for controlling the entire flow process of the signal conversion display 60. The control may be replaced by a microcomputer chip. The digital display unit 63 is connected to the single-chip microprocessing unit 62 for displaying the numerical value of power consumption.

Figure 6:
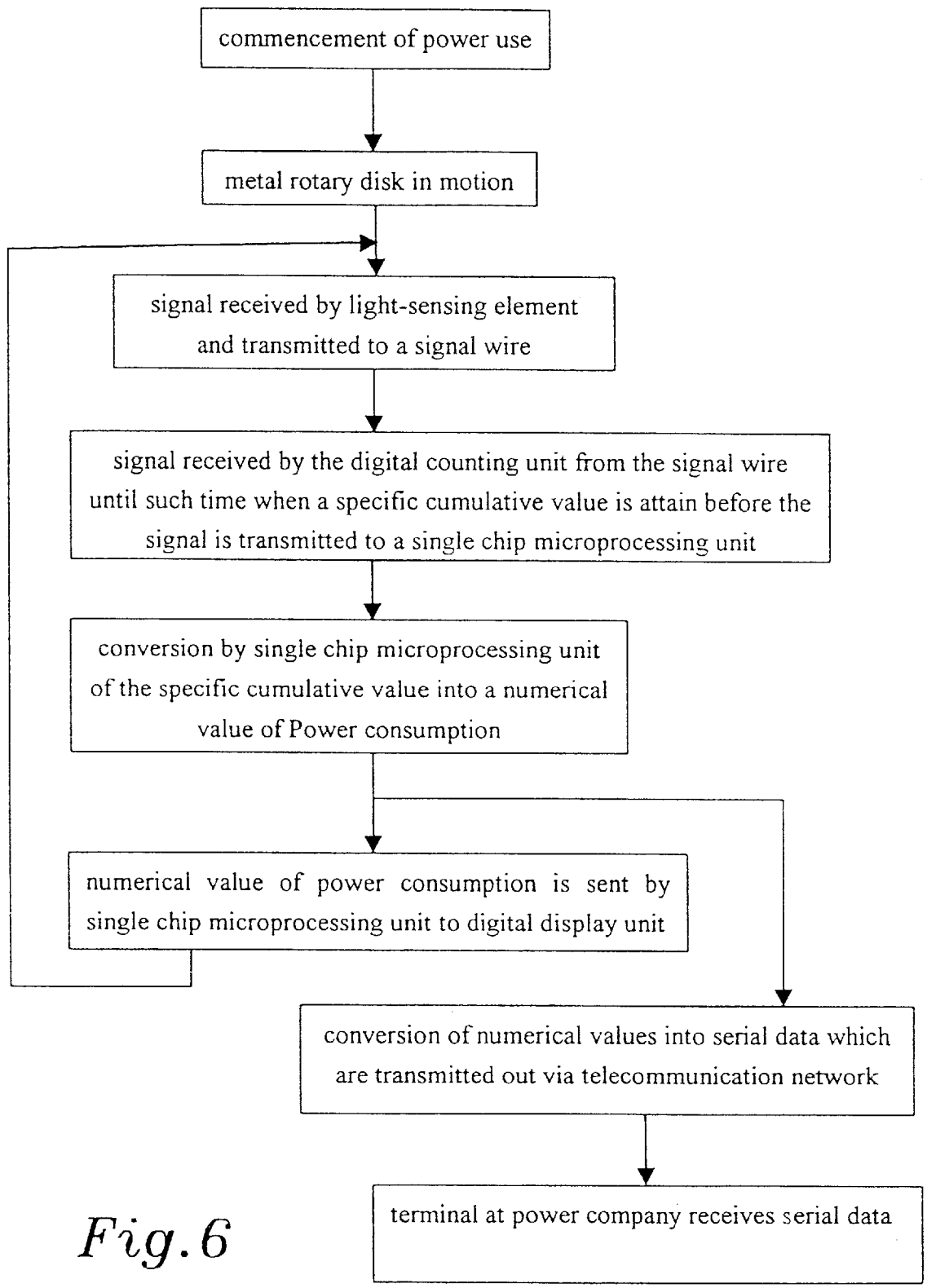
FIG. 6 shows a flow chart of operation of the present invention.

Referring to FIG. 3 and FIG. 6, as soon as the power consumption begins, the metal rotary disk 20 is induced by the magnetic field of the voltage magnet 11 to rotate. In the meantime, the light emitted by the light-emitting end 31 of the light-emitting element 30 is continuously projected on the surface of the metal rotary disk 20. As the through hole 21 of the metal rotary disk 20 is turned to the position of the light-emitting element 30, the light emitted by the light-emitting end 31 is received once by the light-receiving end 41 of the light-sensing element 40 via the through hole 21 of the metal rotary disk 20. As the through hole 21 is moved away from the position of the light-emitting element 30. The light signal emitted by the light-emitting element 30 is obstructed by the metal rotary disk 20, thereby resulting in the interruption in the signal-receiving by the light-sensing element 40. In other words, as the rotary disk 20 completes one revolution, the light-sensing element 40 receives once the light signal. As long as the metal rotary disk 20 keeps turning, the light-sensing element 40 receives continuously the light signal which is converted into a digitized signal The digitized signal is transmitted to the signal conversion display 60 via the signal wire 50. The counting is brought about by the digital counting unit 61. When the signal is accumulated to a certain value, the signal is transmitted to the single-chip microprocessing unit 62 in which the cumulative numerical value is converted into a numerical value of power consumption, which is then exhibited on the digital display unit 63. The digital display unit 63 may be a light emitting diode (LED) or a liquid crystal display (LCD).

As shown in FIGS. 5 and 6, a parallel serial conversion unit 64 is connected to the single-chip microprocessing unit 62 which transmits data in a parallel manner so as to enable the parallel serial conversion unit 64 to receive the serial data at the time when the single-chip microprocessing unit 62 transmits the signal to the digital display unit 63. The parallel serial data received by the parallel serial conversion unit 64 are subsequently transmitted via the telecommunication network or other types of data transmitting network to the terminal located at the power company. A keyboard 65 is connected to the single-chip microprocessing unit 62 to facilitate a variety of resets of the single-chip microprocessing unit 62. The keyboard 65 may be replaced by a touch switch.

What is claimed is:

1. digital meter for measuring alternating current, comprising:

a housing, a voltage magnet disposed in said housing and positioned opposing said electric current magnet to induce a magnetic field there above;

a signal line;

a metal rotary disk, which has two opposing side face and a through hole provided at a periphery edge thereof, comprising a shaft pivotally mounted at a center of said metal rotary disk, wherein said metal rotary disk is coaxially and rotatably mounted over said voltage magnet, wherein said metal rotary disk is induced by said magnetic field to rotate with said shaft simultaneously about an axis of said shaft and a circular moving path of said through hole is defined when said through hole rotates with said metal rotary disk;

a light-emitting element, which is fastened to face one of said side face of said metal rotary disk inside said housing and extended to position adjacent to said periphery edge of said metal rotary disk and define a distance between said light-emitting element and said periphery edge of said metal rotary disk, wherein a light signal is emitted from said light-emitting element and projected on said moving path of said through hole of said metal rotary disk in such a manner that said light signal is capable of passing through said through hole when said through hole is rotated to a position right above said light-emitting element; and a light-sensing element, which is fastened to face another said side face of said metal rotary disk inside said housing and extended to position adjacent to said periphery edge of said metal rotary disk and define a distance between said light-sensing element and said periphery edge of said metal rotary disk, wherein said light-sensing element, which is connected with said signal line for transmitting digital signals, is also positioned opposing to said light-emitting element in such a manner that said light signal emitted through said through hole is capable of being received and sensed by said light-sensing element, wherein when said metal rotary disk is induced to rotate by said magnetic field of said voltage magnet, said light signal emitted from said light emitting end of said light-emitting element is projected continuously on said periphery edge of said metal rotary disk, wherein when said through hole of said metal rotary disk in rotation arrives at said position where said light emitting end is located, said light signal emitted from said light-emitting element is received by said light-sensing element via said through hole of said metal rotary disk, wherein when said metal rotary disk completes one revolution, said light signal is received once by said light-sensing element, wherein as long as said metal rotary disk rotates, said light-sensing element intermittently receives said light signal which is outputted via said signal line; and a signal conversion display receiving and converting said light signal to a numerical value of power consumption.

2. The digital meter for measuring alternating current, as recited in claim 1, wherein said signal conversion display comprises:

a digital counting unit, connected to said signal wire, for converting said signal into a digital signal and decoding said digital signal;

a single-chip microprocessing unit for receiving said decoded digital signal from said digital counting unit and converting into said numerical value of power consumption; and a digital display unit for receiving and exhibiting said numerical value of power consumption.

3. The digital meter for measuring alternating current, as recited in claim 2, wherein said signal conversion display further comprises a parallel serial conversion unit, connected to said single-chip microprocessing unit, for transmitting data in a parallel manner for enabling said digital display unit to receive other serial data while said single-chip microprocessing unit transmitting said numerical value of power consumption to said digital display unit.

* * * * *